(12) United States Patent
Gong et al.

(10) Patent No.: US 10,581,012 B2
(45) Date of Patent: Mar. 3, 2020

(54) ORGANIC LIGHT-EMITTING DIODE AND METHOD FOR MANUFACTURING THE SAME, DISPLAY SUBSTRATE AND METHOD FOR MANUFACTURING THE SAME, AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Kui Gong, Beijing (CN); Xianxue Duan, Beijing (CN); Jilong Li, Beijing (CN); Haifeng Cui, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

(*) Notice: Subject to any disclaimer, the term of this patent is extended or adjusted under 35 U.S.C. 154(b) by 0 days.

(21) Appl. No.: 16/053,424

(22) Filed: Aug. 2, 2018

(65) Prior Publication Data

US 2019/0097166 A1 Mar. 28, 2019

(30) Foreign Application Priority Data

Sep. 22, 2017 (CN) .......................... 2017 1 0865598

(51) Int. Cl.
*H01L 51/52* (2006.01)
*H01L 51/56* (2006.01)
*H01L 51/00* (2006.01)

(52) U.S. Cl.
CPC ...... *H01L 51/5209* (2013.01); *H01L 51/0022* (2013.01); *H01L 51/5271* (2013.01); *H01L 51/56* (2013.01); *H01L 51/5218* (2013.01); *H01L 2251/301* (2013.01); *H01L 2251/305* (2013.01); *H01L 2251/558* (2013.01)

(58) Field of Classification Search
CPC . H01L 51/5209; H01L 51/5218; H01L 51/56; H01L 51/0022; H01L 2251/558
See application file for complete search history.

(56) References Cited

U.S. PATENT DOCUMENTS

| | | | | |
|---|---|---|---|---|
| 8,115,224 B2* | 2/2012 | Kim | ...................... | H01L 33/382 257/79 |
| 8,253,152 B2* | 8/2012 | Lee | ........................ | H01L 33/405 257/79 |
| 8,304,788 B2* | 11/2012 | Fukuda | ............... | H01L 51/5275 257/40 |

(Continued)

*Primary Examiner* — Dung A. Le
(74) *Attorney, Agent, or Firm* — Westman, Champlin & Koehler, P.A.

(57) ABSTRACT

The present disclosure provides an organic light-emitting diode and a method for manufacturing the same, a display substrate and a method for manufacturing the same, and a display device. The organic light-emitting diode comprises a first electrode, a second electrode, and an organic light-emitting layer arranged between the first electrode and the second electrode, in which the second electrode is arranged close to the light-emitting side of the organic light-emitting diode, the first electrode includes a reflective conductive layer, and a surface of the reflective conductive layer close to the second electrode has an uneven structure.

11 Claims, 3 Drawing Sheets

(56) References Cited

U.S. PATENT DOCUMENTS

| | | | |
|---|---|---|---|
| 8,319,244 B2* | 11/2012 | Jeong | H01L 33/42 |
| | | | 257/98 |
| 2007/0018184 A1* | 1/2007 | Beeson | H01L 33/405 |
| | | | 257/98 |
| 2009/0026478 A1* | 1/2009 | Yoon | H01L 33/0079 |
| | | | 257/98 |

* cited by examiner

ORGANIC LIGHT-EMITTING DIODE AND METHOD FOR MANUFACTURING THE SAME, DISPLAY SUBSTRATE AND METHOD FOR MANUFACTURING THE SAME, AND DISPLAY DEVICE

CROSS-REFERENCE TO RELATED APPLICATION

The present disclosure claims a priority to the Chinese Patent Application No. 201710865598.4 filed on Sep. 22, 2017, the disclosures of which are incorporated in their entirety by reference herein.

TECHNICAL FIELD

The present disclosure relates to the field of display technology, in particular to an organic light-emitting diode and a method for manufacturing the same, a display substrate and a method for manufacturing the same, and a display device.

BACKGROUND

Due to self-luminescence, fast response, wide viewing angle, high brightness, lightweight, flexibility and other advantages, the organic light-emitting diode (OLED) is very promising in the potential market, and may become the main development direction of next-generation display technology.

SUMMARY

The present disclosure provides an organic light-emitting diode and a method for manufacturing the same, a display substrate and a method for manufacturing the same, and a display device.

One embodiment of the present disclosure provides an organic light-emitting diode, which includes a first electrode, a second electrode, and an organic light-emitting layer arranged between the first electrode and the second electrode, in which the second electrode is arranged close to a light-emitting side of the organic light-emitting diode, the first electrode includes a reflective conductive layer, and a surface of the reflective conductive layer close to the second electrode has an uneven structure.

Optionally, the first electrode further includes:

a first transparent conductive layer covering the uneven structure and the surface of the reflective conductive layer close to the second electrode, in which a surface of the first transparent conductive layer close to the second electrode is even.

Optionally, the first electrode is an anode of the organic light-emitting diode, and a work function of the first transparent conductive layer is greater than a work function of the reflective conductive layer.

Optionally, the uneven structure includes a plurality of convex structures arranged on the surface of the reflective conductive layer close to the second electrode.

Optionally, the uneven structure includes a plurality of concave structures arranged on the surface of the reflective conductive layer close to the second electrode.

Optionally, a material of the convex structure includes a reflective conductive material, and the reflective conductive material includes nano-silver.

Optionally, the convex structures are in a shape of hemispherical.

Optionally, the plurality of convex structures are distributed in a matrix.

Optionally, a thickness of the first transparent conductive layer is 20 nm to 50 nm, and a height of the convex structure is smaller than the thickness of the first transparent conductive layer.

Optionally, the first electrode further includes:

a second transparent conductive layer arranged on a surface of the reflective conductive layer away from the second electrode.

Optionally, the second electrode is a semi-reflective conductive layer.

Optionally, the second electrode is made of a metal material, and a thickness of the second electrode is 10 nm to 30 nm.

One embodiment of the present disclosure further provides a method for manufacturing the organic light-emitting diode as described above, which includes steps of:

forming the first electrode and the second electrode, in which the second electrode is arranged close to the light-emitting side of the organic light-emitting diode; and forming the organic light-emitting layer between the first electrode and the second electrode;

in which the step of forming the first electrode includes steps of:

forming the reflective conductive layer, and forming the uneven structure on the surface of the reflective conductive layer close to the second electrode.

Optionally, the step of forming the first electrode further includes steps of:

forming a first transparent conductive film covering the uneven structure and the surface of the reflective conductive layer close to the second electrode; and planarizing a surface of the first transparent conductive film close to the second electrode, to form a first transparent conductive layer having an even surface.

Optionally, the step of planarizing includes planarizing a surface of the first transparent conductive film close to the light-emitting side by a chemical mechanical polishing process.

Optionally, the step of forming the uneven structure on the surface of the reflective conductive layer close to the second electrode includes a step of forming a plurality of convex structures on the surface of the reflective conductive layer close to the second electrode by using a reflective conductive material, and the step of forming the plurality of convex structures on the surface of the reflective conductive layer close to the second electrode by using the reflective conductive material includes steps of:

preparing a conductive ink including the reflective conductive material;

printing the conductive ink on the surface of the reflective conductive layer close to the second electrode by an inkjet printing process; and performing a baking process on the conductive ink on the surface of the reflective conductive layer close to the second electrode, to form a hemispherical convex structure by the reflective conductive material, in which the reflective conductive material includes nano-silver.

Optionally, the step of forming the first electrode further includes a step of:

forming a second transparent conductive layer on a surface of the reflective conductive layer away from the second electrode.

One embodiment of the present disclosure further provides a display substrate which includes an organic light-emitting diode as described above.

One embodiment of the present disclosure further provides a method for manufacturing a display substrate which includes manufacturing the organic light-emitting diode according to the method described above.

One embodiment of the present disclosure further provides a display device which includes the display substrate as described above.

BRIEF DESCRIPTION OF THE DRAWINGS

In order to illustrate the technical solutions of the present disclosure in a clearer manner, the drawings desired for the present disclosure will be described hereinafter briefly. Obviously, the following drawings merely relate to some embodiments of the present disclosure. Based on these drawings, a person skilled in the art may obtain the other drawings without any creative effort.

DETAILED DESCRIPTION

Figure 1:
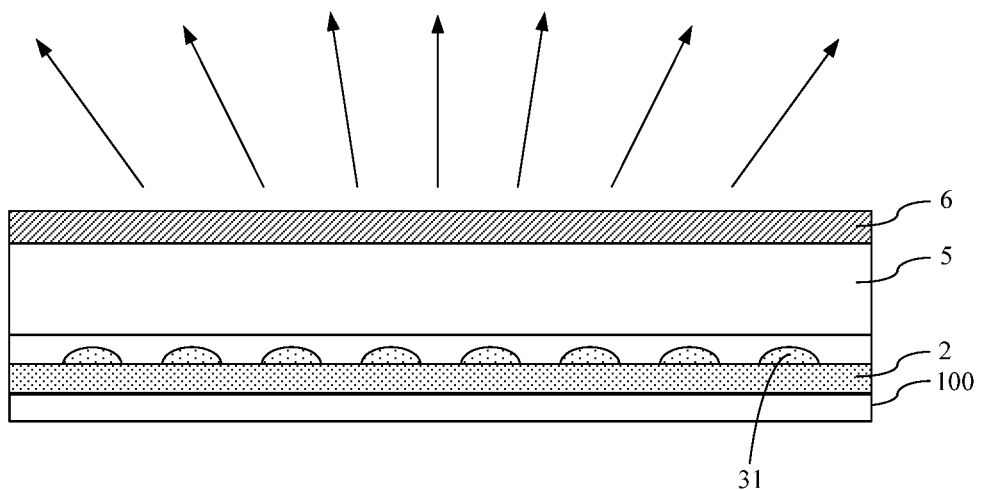
FIG. 1 is a schematic view showing an organic light-emitting diode according to one embodiment of the present disclosure.

In an organic light-emitting diode, the organic light-emitting layer is arranged between two electrodes. When one of the two electrodes is a reflective layer and the other is a semi-reflective layer, the light-emitting layer of the device is located in a resonant cavity formed by the total reflective layer and the semi-reflective layer, and the light is emitted through the semi-reflective layer. When the cavity thickness of the resonant cavity is of the same order of magnitude as a wavelength of a light, the light of a specific wavelength will be selectively enhanced to narrow the spectrum of the exit light of the device, and this is called a microcavity effect.

According to the exit direction of light, OLED may be classified into a bottom emission OLED and a top emission OLED, and embodiments of the present disclosure take a top emission OLED as an example. The light is emitted from the top of the top emission OLED device, and this structure of device may greatly improve the aperture ratio of the display panel due to the immune to the bottom driving of the device. The top emission OLED device generally employs a reflective metal bottom electrode and a transparent or semitransparent top electrode, in which the transparent top electrode is generally made of conductive metal oxide, but the high energy manufacturing process thereof may damage the organic layer, thereby leading to disadvantageous for maintaining device performance. The semitransparent top electrode generally adopts a thin metal layer, in which the thin metal layer has a certain level of light reflectivity, may easily cause a microcavity effect, and leads to a problem in viewing angle, thereby leading to disadvantageous for maintaining the display effect of the display panel.

In order to solve the above technical problem, the present disclosure provides an organic light-emitting diode which includes an uneven structure arranged on the surface of the reflective layer close to the light-emitting side of the device, such that the cavity thickness of the resonant cavity between the reflective layer and the semi-reflective layer is uneven, thereby weakening or even eliminating the microcavity effect. When the organic light-emitting diode is applied to a display device, the problem in viewing angle may be overcome and the display effect of the product may be ensured.

It should be noted that the reflective layer in the present disclosure refers to the total reflective layer, in which 90% or more of the light irradiated onto the reflective layer is reflected back. The semi-reflective layer means that more than 10% of the light irradiated onto the semi-reflective layer passes through the semi-reflective layer, and the rest light is reflected back.

It should be noted that, the technical solution of the present disclosure is for example suitable for a top emission OLED, in which the top electrode close to the light-emitting side of the device is a semi-reflective layer, and the bottom electrode away from the light-emitting side of the device is a reflective layer.

Of course, in the case of a bottom emission OLED, the bottom electrode thereof close to the light-emitting side also employs a semi-reflective layer. When a microcavity effect exists, the microcavity effect may be weakened or even eliminated by using the technical solutions of the present disclosure.

The detailed description of the present disclosure will be further described in detail below with reference to the drawings and examples. The following examples are used to illustrate the present disclosure, but are not intended to limit the scope of the present disclosure.

As shown in FIG. 1, an embodiment of the present disclosure provides an organic light-emitting diode, which includes an organic second electrode 6, a first electrode opposite thereto, and an organic light-emitting layer 5 arranged between the first electrode and the second electrode 6. The organic light-emitting layer 5 is used to emit light of a specific color. The second electrode 6 is arranged close to the light-emitting side of the organic light-emitting diode. The first electrode includes a reflective conductive layer 2, the surface of the reflective conductive layer 2 close to the second electrode 6 has an uneven structure. In FIG. 1, the straight line with an arrow indicates the exit direction of light emitted by the organic light-emitting diode.

In the above technical solution, the first electrode of the organic light-emitting diode includes a reflective conductive layer, and an uneven structure is arranged on a surface of the reflective conductive layer close to the second electrode. The arrangement of the uneven structure makes the cavity thickness of the resonant cavity formed between the first electrode and the second electrode uneven. If a microcavity effect exists, the microcavity effect may be weakened or even eliminated. Moreover, due to the scattering effect of the uneven structure on light, the emitting angle of light is increased, and the uniformity of the light emission of the device is improved.

The second electrode 6 may be a semi-reflective conductive layer, and makes the cavity thickness of the resonant cavity formed between the first electrode and the second electrode 6 uneven, thereby weakening or even eliminating the microcavity effect.

The second electrode 6 may be made of a metal material, and the thickness of the second electrode 6 is 10 nm to 30 nm. Although the metal material has a reflection effect on the light, a relatively thin thickness allows a part of the light to be emitted through the second electrode 6. In addition, when the second electrode 6 is the cathode of the organic light-emitting diode, it is favorable for improving the light-emitting efficiency of the device, since its metal material is a low work function material.

The second electrode 6 may be, for example, made of a low work function metal such as Li, Mg, Ca, Sr, La, Ce, Eu, Yb, Al, Cs or Rb, or an alloy of these metals, and may be a single layer structure or a composite structure of different metal layers.

It should be noted that the second electrode may also be made of other transflective materials or have a structure capable of achieving transflective functions.

In this embodiment, the reflective conductive layer 2 of the first electrode may be made of a metal material, and its thickness is required to ensure a sufficiently large reflectance, so that when the light emitted by the organic light-emitting layer 5 is irradiated onto the first electrode, 90% or more of the light is reflected back and then emitted through the second electrode 6.

The reflective conductive layer 2 may be, for example, made of a metal such as Ag, Mg, Al, Pt, Pd, Au, Ni or Nd. Taking the reflective conductive layer 2 made of Ag metal as an example, the thickness of the reflective conductive layer 2 is required to be 15 nm to 25 nm, for example, about 20 nm, to ensure a sufficiently large reflectance.

Figure 2:
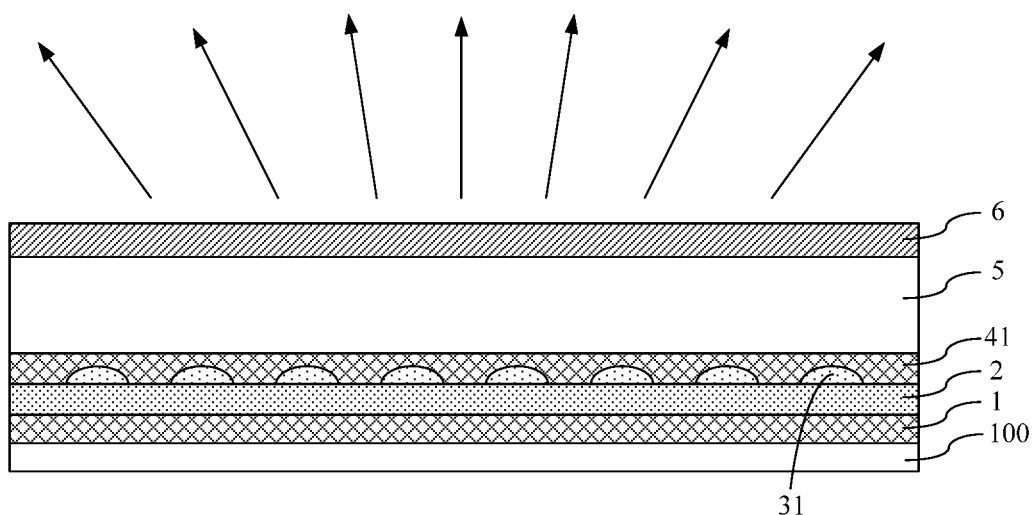
FIG. 2 is a schematic view showing an organic light-emitting diode according to another embodiment of the present disclosure.

Optionally, as shown in FIG. 2, the first electrode may further include a first transparent conductive layer 41 covering the uneven structure and the surface of the reflective conductive layer 2 close to the second electrode 6, and a surface of the first transparent conductive layer 41 close to the light-emitting side is even. By arranging the reflective conductive layer, the technical solution may provide an even surface for manufacturing the organic light-emitting layer, thereby ensuring the organic light-emitting layer to have a uniform thickness, and preventing the problem of uneven light emission caused by the uneven thickness of the organic light-emitting layer.

Further, the first transparent conductive layer 41 may be formed of a transparent conductive material having a high work function, e.g., a transparent conductive material such as ITO, IZO, AZO, IGZO or ITZO. When the first electrode is the anode of the organic light-emitting diode and the first transparent conductive layer 41 is made of a material having a high work function, the work function of the first transparent conductive layer 41 is greater than the work function of the first electrode, which is favorable for improving the light-emitting efficiency of the device.

It is easily conceivable that the thickness of the first transparent conductive layer 41 is required to satisfy the condition of completely covering the uneven structure, that is, the thickness of the first transparent conductive layer 41 is greater than the height or depth of the uneven structure, so as to fill up the uneven structure, thereby achieving an even surface of the first transparent conductive layer 41 close to the second electrode 6. The thickness of the first transparent conductive layer 41 may be, for example, 20 nm to 50 nm.

Optionally, as shown in FIG. 2, the first electrode may further include a second transparent conductive layer 1 arranged on the surface of the reflective conductive layer 2 away from the second electrode 6, to protect the reflective conductive layer 2 from water and oxygen corrosion.

The thickness of the second transparent conductive layer 1 may be 5 nm to 15 nm, and the second transparent conductive layer 1 may be made of a transparent conductive material such as ITO, IZO, AZO, IGZO or ITZO.

In one embodiment, as shown in FIG. 2, for example, the first electrode is an anode of an organic light-emitting diode, and the first electrode includes:

a second transparent conductive layer 1;

a reflective conductive layer 2 arranged on the surface of the second transparent conductive layer 1 close to the second electrode 6, in which a surface of the reflective conductive layer 2 close to the second electrode 6 has an uneven structure; and a first transparent conductive layer 41 covering the uneven structure and the surface of the reflective conductive layer 2 close to the second electrode 6, in which the first transparent conductive layer 41 is formed by a transparent conductive material having a high work function, such as ITO, IZO, AZO, IGZO, ITZO or other transparent conductive material having a high work function, and the work function thereof is greater than the work function of the reflective conductive layer 2.

In this embodiment, the first electrode prepared by the above steps has a three-layer structure, in which the reflective conductive layer is arranged between the two transparent conductive layers to better protect the first electrode from water and oxygen corrosions. When the first electrode is an anode, the transparent conductive layer arranged on the surface of the reflective conductive layer close to the second electrode may also improve the light-emitting efficiency of the device, and ensure a uniform light emission.

In the technical solution of the present disclosure, one of the electrodes of the organic light-emitting diode includes a reflective conductive layer, and the microcavity effect may be weaken or even eliminated by forming an uneven structure on the surface of the reflective conductive layer close to the light-emitting side of the device.

Figure 9:
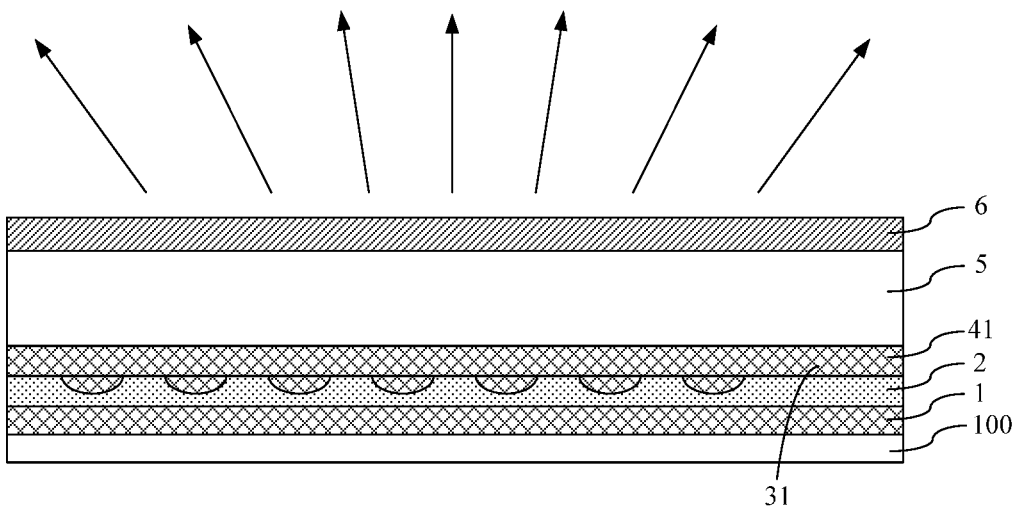
FIG. 9 is a schematic view showing an organic light-emitting diode according to yet another embodiment of the present disclosure.

Further, there are several methods to allow the surface of the reflective conductive layer close to the light-emitting side of the device to have an uneven structure. For example, a plurality of concave structures can be formed on the surface of the reflective conductive layer close to the light-emitting side of the device (i.e., close to the second electrode) by an etching process, in which the uneven structure includes the plurality of concave structures, as shown in FIG. 9; or a film layer structure having an unevenly distributed thickness can be formed on the surface of the reflective conductive layer close to the light-emitting side of the device, in which the film layer forms the uneven structure.

As shown in FIG. 1, in the embodiment, the uneven structure includes, for example, a plurality of convex structures 31 arranged on the surface of the reflective conductive layer 2 close to the light-emitting side. For example, the plurality of convex structures 31 may be directly formed by an inkjet printing process. In this case, the process is simple and it is not necessary to go through a complicated photolithography process, thereby shortening the process time. Examples of the manufacturing process of the plurality of convex structures 31 will be described in detail hereafter.

According to the material and the manufacturing process used, the convex structure 31 may be of a regular shape or an irregular shape. The plurality of convex structures 31 may be distributed in a matrix. Further, the distance between two adjacent convex structures may be 5 nm to 100 nm, so as to weaken or even eliminate the microcavity effect, and achieve the purpose of increasing the emitting angle of light.

Optionally, a material of the convex structure 31 includes a reflective conductive material, which is equivalent to forming a convex mirror on the surface of the reflective conductive layer 2, so as to increase the scattering effect on light, thereby increasing the emitting angle of light of the device and improving the uniformity of light emission without affecting the light-emitting efficiency of the device.

Further, the reflective conductive material may include nano-silver. When directly printing the conductive ink including nano-silver on the surface of the reflective conductive layer close to the second electrode by an inkjet printing process, the resulting convex structure is hemispherical.

Of course, other reflective conductive materials may be selected for the convex structure, and for example, the same material as that of the reflective conductive layer may be selected, or one or more materials suitable for the reflective conductive layer may be selected.

As shown in FIG. 2, when the organic light-emitting diode includes a first transparent conductive layer 41 covering the uneven structure and the surface of the reflective conductive layer 2 close to the second electrode 6, the thickness of the first transparent conductive layer 41 may be set as 20 nm to 50 nm, and the height of the convex structure 31 (refer to the maximum height of the plurality of convex structures 31) may be smaller than the thickness of the first transparent conductive layer 41, thereby achieving an even surface of the first transparent conductive layer 41 close to the second electrode 6.

As shown in FIG. 2, in this embodiment, the organic light-emitting diode may include:

a base 100;

an anode (i.e., a first electrode) arranged on the base 100;

an organic light-emitting layer 5 arranged on the surface of the anode away from the base 100; and a cathode 6 (i.e., a second electrode) arranged on the surface of the organic light-emitting layer 5 away from the anode, in which the cathode 6 is made of a metal material having a low work function and has a thickness of 10 nm to 30 nm.

The anode includes:

a second transparent conductive layer 1 arranged on the base 100, having a thickness of 5 nm to 15 nm;

a reflective conductive layer 2 arranged on the surface of the second transparent conductive layer 1 away from the base 100, in which the reflective conductive layer 2 may be made of Ag metal and have a thickness of 15 nm to 25 nm, for example, about 20 nm;

a plurality of convex structures 31 arranged on the surface of the reflective conductive layer 2 away from the second transparent conductive layer 1, in which the plurality of convex structures 31 are distributed in a matrix, a material of the convex structure 31 includes a reflective conductive material, the reflective conductive material includes nano-silver, and the distance between two adjacent convex structures 31 is 5 nm to 100 nm; and a first transparent conductive layer 41 covering the plurality of convex structures 31 and the surface of the reflective conductive layer 2 away from the second transparent conductive layer 1, in which the thickness of the first transparent conductive layer 41 is 20 nm to 50 nm, larger than the maximum height of the convex structure 31. The first transparent conductive layer 41 is a transparent conductive material having a high work function.

Of course, the organic light-emitting diode may further include functional layers such as an electron injection layer, an electron transport layer, a hole injection layer or a hole transport layer, which will not be described in detail herein.

One embodiment of the present disclosure further provides a method for manufacturing the organic light-emitting diode described above, which includes steps of:

forming a first electrode and a second electrode, in which the second electrode is arranged close to a light-emitting side of the organic light-emitting diode; and forming an organic light-emitting layer between the first electrode and the second electrode;

in which the step of forming the first electrode includes steps of:

forming a reflective conductive layer, and forming an uneven structure on the surface of the reflective conductive layer close to the second electrode.

In the organic light-emitting diode obtained by the above manufacturing method, the first electrode includes a reflective conductive layer, and a surface of the reflective conductive layer close to the second electrode is formed with an uneven structure. The arrangement of the uneven structure is formed to make the cavity thickness of the resonant cavity formed between the first electrode and the second electrode uneven. If a microcavity effect exists, the microcavity effect may be weakened or even eliminated. Moreover, due to the scattering effect of the uneven structure on light, the emitting angle of light is increased, and the uniformity of the light emission of the device is improved.

For example, the second electrode may be made of a metal such as Li, Mg, Ca, Sr, La, Ce, Eu, Yb, Al, Cs or Rb, or an alloy of these metals, and may be a single layer structure or a composite structure of different metal layers. The thickness of the second electrode may be 10 nm to 30 nm. Although the metal material has a reflection effect on light, a relatively thin thickness allows a part of the light to be emitted through the second electrode. That is to say, the second electrode is a semi-reflective conductive layer, and makes the cavity thickness of the resonant cavity formed between the first electrode and the second electrode uneven, thereby weakening or even eliminating the microcavity effect. In addition, when the second electrode is a cathode, it is favorable for improving the light-emitting efficiency of the device, since the metal material is a low work function material.

For example, a reflective conductive layer of the first electrode may be made of a metal such as Ag, Mg, Al, Pt, Pd, Au, Ni or Nd. The thickness of the reflective conductive layer is required to ensure a sufficiently large reflectance of the reflective conductive layer.

Optionally, the step of forming the first electrode further includes steps of:

forming a first transparent conductive film covering the uneven structure and the surface of the reflective conductive layer close to the second electrode; and planarizing the surface of the first transparent conductive film close to the second electrode, to form a first transparent conductive layer having an even surface.

The first electrode prepared in the above steps further includes a first transparent conductive layer covering the surface of the reflective conductive layer close to the second electrode, and a surface of the first transparent conductive layer close to the second electrode is an even surface. On the one hand, the technical solution may provide an even surface for manufacturing the organic light-emitting layer, thereby ensuring the organic light-emitting layer to have a uniform thickness, and preventing the problem of uneven light emission caused by the uneven thickness of the organic light-emitting layer. On the other hand, when the first electrode is the anode of the organic light-emitting diode and the first transparent conductive layer is made of a material having a high work function, the work function of the first transparent conductive layer is greater than the work function of the first electrode, which is favorable for improving the light-emitting efficiency of the device.

For example, the first transparent conductive film may be made of a transparent conductive material having a high work function such as ITO, IZO, AZO, IGZO or ITZO. The thickness of the first transparent conductive layer is required to satisfy the condition of completely covering the uneven structure.

In this embodiment, the surface of the first transparent conductive film close to the light-emitting side may be planarized by a chemical mechanical polishing process, to form a first transparent conductive layer having an even surface. The chemical mechanical polishing process has the following advantages: (1) an overall planarization may be achieved; (2) planarization may be achieved for different materials, and the application range is wide; (3) a simultaneous planarization of different materials may be achieved in one planarizing process; (4) as compared with other planarizing method, it has less surface defects; and (5) no dangerous gas is used, thereby ensuring the personal safety of staffs.

Optionally, the step of forming the first electrode further includes a step of:

forming a second transparent conductive layer on the surface of the reflective conductive layer away from the second electrode.

The second transparent conductive layer obtained by the above steps is capable of protecting the reflective conductive layer from water and oxygen corrosion.

For example, the second transparent conductive layer may be made of a transparent conductive material such as ITO, IZO, AZO, IGZO or ITZO, and the thickness of the second transparent conductive layer may be 5 nm to 15 nm.

Figure 8:
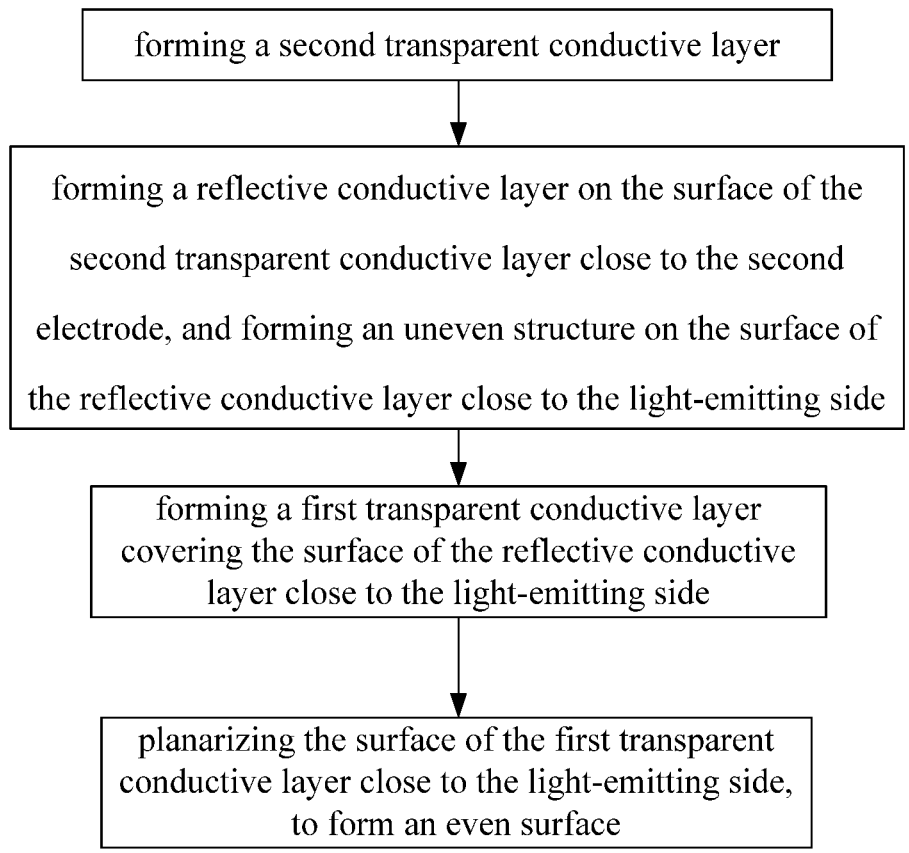
FIG. 8 is a flow chart showing the step of manufacturing a first electrode of an organic light-emitting diode according to one embodiment of the present disclosure.

In one embodiment, as shown in FIG. 8, the first electrode is the anode of the organic light-emitting diode, and the step of forming the first electrode includes steps of:

forming a second transparent conductive layer;

forming a reflective conductive layer on the surface of the second transparent conductive layer close to the second electrode, and forming an uneven structure on the surface of the reflective conductive layer close to the second electrode; and forming a first transparent conductive layer covering the uneven structure and the surface of the reflective conductive layer close to the second electrode.

The first electrode prepared by the above steps has a three-layer structure, in which the reflective conductive layer is arranged between the two transparent conductive layers to better protect the first electrode from water and oxygen corrosions. When the first transparent conductive layer is a transparent conductive material having a high work function, it may further improve the light-emitting efficiency of the device, and ensure a uniform light emission.

In this embodiment, the step of forming an uneven structure on the surface of the reflective conductive layer close to the second electrode includes a step of:

forming a plurality of convex structures on the surface of the reflective conductive layer close to the second electrode.

In the above step, the plurality of convex structures are formed on the surface of the reflective conductive layer close to the second electrode, so that the uneven structure includes the plurality of convex structures.

For example, the plurality of convex structures may be directly formed on the surface of the reflective conductive layer close to the second electrode by an inkjet printing process. In this case, the process is simple and it is not necessary to go through a complicated photolithography process, thereby shortening the process time.

Optionally, the plurality of convex structures are formed of a reflective conductive material on the surface of the reflective conductive layer close to the second electrode, so that the convex structure is equivalent to a convex mirror, and increases the scattering effect on light on the first electrode, thereby increasing the emitting angle of light of the device and allowing the light to emit uniformly. Moreover, this does not affect the light-emitting efficiency of the device.

The step of forming the plurality of convex structures on the surface of the reflective conductive layer close to the second electrode by using a reflective conductive material through the inkjet printing process may include steps of:

preparing a conductive ink including the reflective conductive material;

printing the conductive ink on the surface of the reflective conductive layer close to the second electrode by an inkjet printing process; and performing a baking process on the conductive ink on the surface of the reflective conductive layer close to the second electrode, to form a hemispherical convex structure by the reflective conductive material, in which the reflective conductive material includes nano-silver.

In the above steps, the conductive ink including the nano-silver particles is directly printed on the surface of the reflective conductive layer close to the second electrode by the inkjet printing process, then the solution in the conductive ink is removed by the baking process, and the nano-silver particles are melt into a hemispherical convex structure, in which the process is simple and easy to achieve.

In the above steps, the particle size of the nano-silver particles may be set to be less than 20 nm, and the concentration of the nano-silver particles in the conductive ink may be 30% to 80%. After baking at a temperature below 100° C. for 30 min, the nano-silver particles may be melt into a hemispherical convex structure.

The plurality of convex structures may be distributed in a matrix. The space between two adjacent convex structures may be set as 5 nm to 100 nm, so as to weaken or even eliminate the microcavity effect. Moreover, the plurality of convex structures form a convex mirror array, thereby increasing the scattering effect of the first electrode on light, achieving the purpose of increasing the emitting angle of light, and improving the uniformity of light emission.

As shown in FIG. 1 to FIG. 7, in this embodiment, the method for manufacturing an organic light-emitting diode may include:

providing a base 100;

forming an anode (i.e., a first electrode) on the base 100;

forming an organic light-emitting layer 5 on the surface of the anode away from the base 100; and forming a cathode 6 (i.e., a second electrode) on the surface of the organic light-emitting layer 5 away from the anode.

Thus, the organic light-emitting diode of the embodiment of the present disclosure is formed, as shown in FIG. 1.

Figure 3:
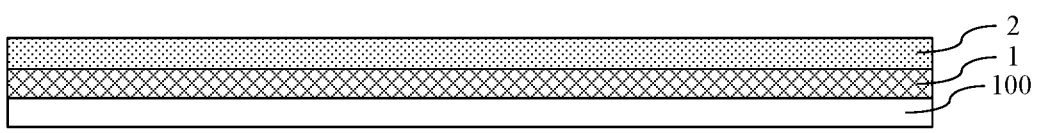
FIG. 3 to FIG. 7 are schematic views showing the step of manufacturing a first electrode of an organic light-emitting diode according to one embodiment of the present disclosure.
Figure 4:
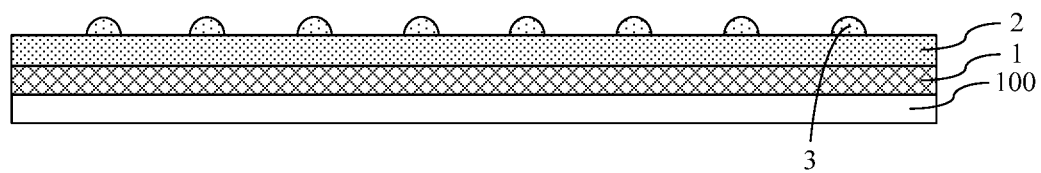
Figure 5:
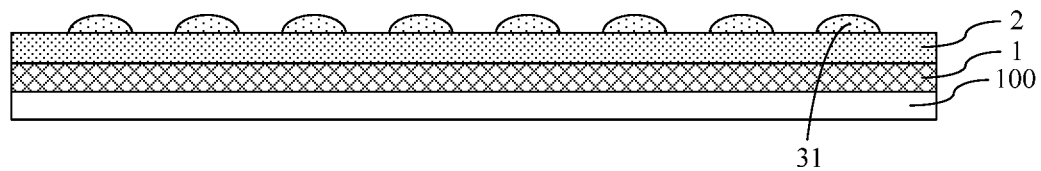
Figure 6:
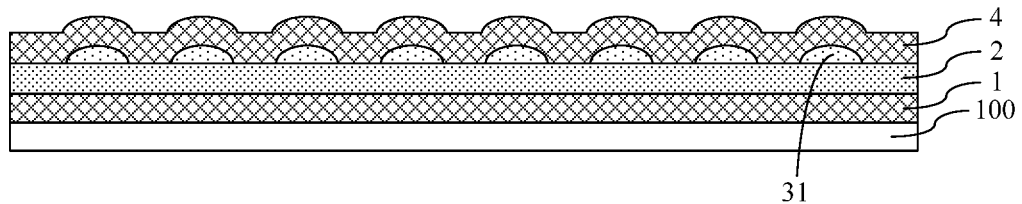
Figure 7:
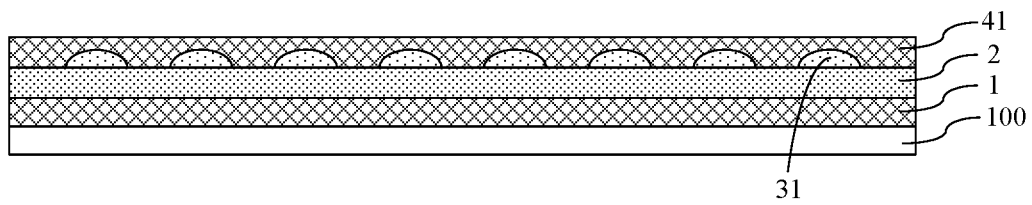

As shown in FIG. 3 to FIG. 7, the step of forming the anode includes:

forming a second transparent conductive layer 1 on the base 100, as shown in FIG. 3;

forming a reflective conductive layer 2 on the surface of the second transparent conductive layer 1 close to the cathode 6 by magnetron sputtering, thermal evaporation or other film forming method, as shown in FIG. 3;

printing the conductive ink including nano-silver directly on the surface of the reflective conductive layer 2 close to the cathode 6 by an inkjet printing process, to form a pattern of the conductive ink 3, as shown in FIG. 4;

performing a baking process on the conductive ink 3 on the surface of the reflective conductive layer 2 close to the cathode 6, to allow the nano-silver particles included in the conductive ink 3 melt into a hemispherical convex structure 31, thereby forming an uneven structure on the surface of the reflective conductive layer 2 close to the light-emitting side, as shown in FIG. 5;

forming a first transparent conductive film 4 covering the plurality of convex structures 31 and the surface of the reflective conductive layer 2 close to the cathode 6, as shown in FIG. 6, in which the first transparent conductive film 4 is made of a transparent conductive material having a high work function; and planarizing the surface of the first transparent conductive film 4 close to the cathode 6 by a chemical mechanical polishing process to form a first transparent conductive layer 41 having an even surface, as shown in FIG. 7.

As described above, an anode (i.e., a first electrode) is formed on the base 100. Further, the organic light-emitting layer 5 and the cathode 6 are sequentially formed on the surface of the first transparent conductive layer 41 close to the cathode 6, and thus the manufacture of the organic light-emitting diode shown in FIG. 2 is completed.

Of course, the method for manufacturing the organic light-emitting diode may further include the steps of forming functional film layers such as an electron injection layer, an electron transport layer, a hole injection layer or a hole transport layer, which will not be described in detail herein.

One embodiment of the present disclosure further provides a display substrate and a method for manufacturing the display substrate, in which the display substrate includes the organic light-emitting diode in the above embodiment. The method for manufacturing the display substrate includes manufacturing the organic light-emitting diode according to the method in the above embodiment. As for the structure of the display substrate and process steps, reference may be made to related art, which will not be described in detail herein.

One embodiment of the present disclosure further provides a display device including the display substrate as described above.

In the above technical solution, since the microcavity effect of the organic light-emitting diode may be weakened or even eliminated and the scattering effect on light is increased, the problem in viewing angle of the display product is eliminated, and the display effect is ensured.

The display device may be an organic light-emitting display panel, a mobile phone, a tablet computer, a television, a display, a notebook computer, a digital photo frame, a navigator, or any other product or component having a display function.

The above descriptions are merely preferred embodiments of the present disclosure. It should be noted that one skilled in the art would make several improvements and substitutions without departing from the principles of the present disclosure. These improvements and modifications should also be regarded as the protection scope of the present disclosure.

What is claimed is:

1. A method for manufacturing the organic light-emitting diode, comprising steps of:
    forming the first electrode and the second electrode, wherein the second electrode is arranged close to the light-emitting side of the organic light-emitting diode; and
    forming the organic light-emitting layer between the first electrode and the second electrode,
    wherein the step of forming the first electrode comprises steps of:
    forming the reflective conductive layer; and
    forming a plurality of convex structures on a surface of the reflective conductive layer close to the second electrode by using a reflective conductive material,
    wherein the step of forming the plurality of convex structures on the surface of the reflective conductive layer close to the second electrode by using the reflective conductive material comprises steps of:
    preparing a conductive ink comprising the reflective conductive material;
    printing the conductive ink on the surface of the reflective conductive layer close to the second electrode by an inkjet printing process; and
    performing a baking process on the conductive ink on the surface of the reflective conductive layer close to the second electrode, to form a hemispherical convex structure by the reflective conductive material,
    wherein the reflective conductive material comprises nano-silver.

2. The method according to claim 1, wherein the step of forming the first electrode further comprises steps of:
    forming a first transparent conductive film covering the uneven structure and the surface of the reflective conductive layer close to the second electrode; and
    planarizing a surface of the first transparent conductive film close to the second electrode, to form a first transparent conductive layer having an even surface.

3. The method according to claim 2, wherein the step of planarizing comprises planarizing a surface of the first transparent conductive film close to the light-emitting side by a chemical mechanical polishing process.

4. The method according to claim 1, wherein the step of forming the first electrode further comprises a step of:
    forming a second transparent conductive layer on a surface of the reflective conductive layer away from the second electrode.

5. A method for manufacturing a display substrate, comprising manufacturing the organic light-emitting diode according to the method of claim 1.

6. The method according to claim 1, wherein the first electrode is an anode of the organic light-emitting diode, and a work function of the first transparent conductive layer is greater than a work function of the reflective conductive layer.

7. The method according to claim 1, wherein the convex structures are in a shape of hemispherical.

8. The method according to claim 1, wherein the plurality of convex structures is distributed in a matrix.

9. The method according to claim 1, wherein a thickness of the first transparent conductive layer is 20 nm to 50 nm, and a height of the convex structure is smaller than the thickness of the first transparent conductive layer.

10. The method according to claim 1, wherein the second electrode is a semi-reflective conductive layer.

11. The method according to claim 1, wherein the second electrode is made of a metal material, and a thickness of the second electrode is between 10 nm to 30 nm.

\* \* \* \* \*